US012754216B2

(12) United States Patent
Barwig

(10) Patent No.: US 12,754,216 B2
(45) Date of Patent: Oct. 6, 2026

(54) CURRENT SENSOR

(71) Applicant: Schaeffler Technologies AG & Co. KG, Herzogenaurach (DE)

(72) Inventor: Markus Barwig, Erlangen (DE)

(73) Assignee: Schaeffler Technologies AG & Co. KG, Herzogenaurach (DE)

( * ) Notice: Subject to any disclaimer, the term of this patent is extended or adjusted under 35 U.S.C. 154(b) by 204 days.

(21) Appl. No.: 18/576,774

(22) PCT Filed: Jun. 24, 2022

(86) PCT No.: PCT/DE2022/100468

§ 371 (c)(1),
(2) Date: Jan. 5, 2024

(87) PCT Pub. No.: WO2023/006138

PCT Pub. Date: Feb. 2, 2023

(65) Prior Publication Data

US 2024/0302413 A1 Sep. 12, 2024

(30) Foreign Application Priority Data

Jul. 30, 2021 (DE) ..................... 10 2021 119 837.2

(51) Int. Cl.

*G01R 15/20* (2006.01)
*G01R 1/04* (2006.01)
*G01R 19/00* (2006.01)

(52) U.S. Cl.

CPC ......... *G01R 15/207* (2013.01); *G01R 1/0416* (2013.01); *G01R 19/0092* (2013.01)

(58) Field of Classification Search

CPC . G01R 15/207; G01R 19/0092; G01R 1/0416
See application file for complete search history.

(56) References Cited

U.S. PATENT DOCUMENTS

| | | | | |
|---|---|---|---|---|
| 9,063,185 | B2 * | 6/2015 | Hebiguchi | G01R 15/205 |
| 11,047,884 | B2 | 6/2021 | Shimizu | |
| 11,226,382 | B2 * | 1/2022 | Augendre | G01R 33/09 |
| 11,366,139 | B2 * | 6/2022 | Hammerschmidt | G01R 19/0092 |
| 2015/0204919 | A1 * | 7/2015 | Akimoto | G01R 15/207 324/244 |
| 2015/0338444 | A1 * | 11/2015 | Ivanov | G01R 33/09 324/117 R |
| 2019/0178917 | A1 * | 6/2019 | Shimizu | G01R 19/0092 |
| 2020/0011902 | A1 * | 1/2020 | Shimizu | G01R 19/0092 |
| 2021/0373050 | A1 * | 12/2021 | Houis | G01R 19/0092 |
| 2023/0071087 | A1 * | 3/2023 | Vuillermet | G01R 15/207 |

(Continued)

FOREIGN PATENT DOCUMENTS

| | | | |
|---|---|---|---|
| CN | 102298084 | A | 12/2011 |
| CN | 111693748 | A | 9/2020 |

(Continued)

*Primary Examiner* — Dominic E Hawkins
(74) *Attorney, Agent, or Firm* — Volpe Koenig

(57) ABSTRACT

A current sensor includes an electrically conductive busbar with an upper side and a lower side. A cutout is formed adjacent to a tapering of the busbar. A carrier of a magnetic detection element is positioned relative to the cutout such that the magnetic detection element is positioned one of above the upper side or below the lower side of the busbar relative to the busbar.

17 Claims, 8 Drawing Sheets

(56) References Cited

U.S. PATENT DOCUMENTS

| | | | | |
|---|---|---|---|---|
| 2023/0298779 | A1* | 9/2023 | Messier | H01B 5/02<br>324/114 |
| 2024/0264205 | A1* | 8/2024 | Spitzer | G01R 15/202 |
| 2024/0412891 | A1* | 12/2024 | Messier | G01R 15/207 |
| 2025/0052791 | A1* | 2/2025 | Kasparek | G01R 15/207 |

FOREIGN PATENT DOCUMENTS

| | | | |
|---|---|---|---|
| CN | 212060400 | U | 12/2020 |
| DE | 102011076933 | A1 | 12/2011 |
| DE | 202013010178 | U1 | 2/2015 |
| DE | 102008039568 | B4 | 3/2015 |
| DE | 102017114377 | A1 | 12/2017 |
| DE | 102018125404 | A1 | 6/2019 |
| DE | 102018130954 | A1 | 6/2019 |
| DE | 102019114554 | B3 | 9/2020 |
| DE | 112019001437 | T5 | 12/2020 |
| DE | 102019121385 | A1 | 2/2021 |
| EP | 1206046 | A2 | 5/2002 |
| JP | 2005283451 | A | 10/2005 |
| JP | 2018141634 | A | 9/2018 |
| WO | 2012050048 | A1 | 4/2012 |
| WO | 2019181170 | A1 | 9/2019 |
| WO | 2021023874 | A1 | 2/2021 |

* cited by examiner

CURRENT SENSOR

CROSS-REFERENCE TO RELATED APPLICATIONS

This application is the U.S. National Phase of PCT Appln. No. PCT/DE2022/100468 filed Jun. 24, 2022, which claims priority to DE 102021119837.2 filed Jul. 30, 2021, the entire disclosures of which are incorporated by reference herein.

TECHNICAL FIELD

The present disclosure relates to a current sensor. In particular, the current sensor comprises an electrically conductive busbar having an upper side and a lower side, wherein a measuring current to be measured flows through the busbar. A tapering is formed in the busbar, and at least one magnetic detection element is assigned to the busbar in the region of the tapering.

BACKGROUND

The published German patent application DE 10 2017 114 377 A1 discloses a current sensor. To determine the current flowing in a busbar, the busbar has a throughhole formed into which the current sensor engages. The busbars are positioned between two shielding plates to shield the magnetic field from outside. The current sensor can be designed as a giant magnetoresistance (GMR) sensor, as an anisotropic magnetoresistive (AMR) sensor, as a tunnel magnetoresistance (TMR) sensor, or as a Hall IC sensor. A disadvantage of the prior art is that additional shielding plates are provided to homogenize the magnetic field in the region of the sensor.

The German patent application DE 10 2018 125 404 A1 describes a current sensor that contains three busbars. A first shielding plate and a second shielding plate made of a magnetic material are arranged in such a manner that the three busbars are sandwiched in therebetween. Three magnetic detection elements are each arranged between the three busbars and the first shielding plate to detect the magnetic field strength generated by the corresponding busbars. A conductive plate is arranged in such a manner that the three busbars are sandwiched together between the conductive plate and the second shielding plate. The conductive plate is made of a non-magnetic conductive material. Another disadvantage here is the complicated and cost-intensive structure.

The German patent application DE 10 2018 130 954 A1 discloses a current sensor for measuring a current flowing through a busbar. The current sensor contains a circuit board mounted on the busbar with a magnetic sensing element for detecting a strength of a magnetic field generated by a current flowing in the busbar. A housing containing a first and a second housing is formed such that the busbar and the board are sandwiched in therebetween in a plate thickness direction of the busbar.

The German translation DE 11 2019 001 437 T5 of the international patent application WO 2019/181170 discloses a current sensor having an electrically conductive element, a magnetoelectric transducer and a shielding. A part of the electrically conductive element and the magnetoelectric transducer are located between the surface of the first shielding and the surface of the second shielding. The portion of the electrically conductive element located between the first and second shieldings extends in an extension direction that runs along the surface of the second shielding. The second shielding has two sides that are aligned in a transverse direction perpendicular to the extension direction and multiple extension parts that extend on the sides toward the first shielding and are aligned with and spaced apart from one another in the extension direction. The magnetoelectric transducer is located between the multiple extension parts that are aligned and spaced apart in the extension direction.

German patent application DE 10 2011 076 933 A1 describes a current sensor comprising a conductive element and at least two magnetic field sensors arranged on the conductive element and adapted to detect a magnetic field generated by a current through the conductor element. The at least two magnetic field sensors are arranged on opposite sides of a line perpendicular to a current flow direction in the conductive element. An insulating layer is arranged between the conductive element and the magnetic field sensors and a conductor track is connected to the magnetic field sensors.

Conventional coreless current sensors typically have several disadvantages compared to cored current sensors. Thus, for example, an undesirable dependence of the output signal on the frequency of the impressed current (skin effect) is present. The current sensors also result in an undesirable dependence on the exact positioning of the sensor element relative to the busbars. Furthermore, the coreless current sensors have a lower signal level compared to cored current sensors. Added to this is the susceptibility of coreless current sensors to external magnetic fields.

The disadvantages of coreless current sensors can be reduced by various measures. In the region of the sensor, for example, the cross-section of the busbar can be reduced. By reducing the cross-section, on the one hand the signal level (flux density) increases, and on the other hand the frequency dependence is reduced. At the same time, however, the positioning of the current sensors becomes more critical.

Another option is to use additional flux-conducting materials as shielding. Using the additional flux-conducting materials, the field in the region of the magnetic detection element (sensor) can be homogenized. An exact positioning of the magnetic detection element is therefore no longer critical.

The frequency response of the magnetic detection elements is corrected by additional external filters (resistors, inductors, capacitances). However, this typically reduces the output voltage range of the magnetic detection elements. For example, the "full" output voltage range of at least 6%-94% of the supply voltage is required, which means that the signal must be amplified again with an operational amplifier in a subsequent stage. Filter measures therefore shift the DC operating point.

SUMMARY

The present disclosure, according to an exemplary embodiment, provides a current sensor which avoids all disadvantages of the prior art, for example, such as complex filter measures, or avoids strong sensitivity to positioning tolerances, and still ensures a reliable measurement of the current carried in a busbar.

The current sensor is characterized by the fact that a cutout is formed in the region of the tapering. Furthermore, a carrier of the at least one magnetic detection element is positioned in the cutout such that the at least one magnetic detection element is positioned above the upper side or above the lower side of the busbar relative to the busbar.

The tapering of the busbar has the effect of reducing the skin effect. The skin effect is a current displacement effect in electrical conductors through which higher-frequency alternating current flows, which means that the current density inside a conductor is lower than in external regions. The cause of the skin effect is that the alternating fields penetrating the conductor are largely attenuated before they reach the inside of the conductor due to the high conductivity of the material.

The skin effect occurs in conductors that are thick relative to the skin depth, and also in electrically conductive shieldings and cable shieldings. As the frequency increases, the skin effect favors the transfer impedance of shielded cables and the shielding attenuation of conductive shieldings, and increases the resistance of an electrical cable.

To further reduce the influence of the skin effect and at the same time maintain a homogeneous field in the middle above or below the busbar, a cutout (elongated hole) is milled or punched into the middle of the busbar.

The present disclosure is based on creating a current sensor that avoids all the disadvantages of the prior art and still ensures reliable measurement of the current carried in a busbar.

According to the present disclosure, a cutout is formed in the region of the tapering. The evaluation can take place above or below the busbar. For this purpose, the at least one magnetic detection element is positioned above the upper side or below lower side of the busbar relative to the busbar. For this purpose, a carrier of the at least one magnetic detection element is positioned in the cutout in such a way that the at least one magnetic detection element is positioned above the upper side or below the lower side of the busbar relative to the busbar.

The advantage of the current sensor according to the present disclosure is that it requires no or only light filtering measures and does not require an operational amplifier. Furthermore, the current sensor according to the present disclosure has no, or only a slight, sensitivity to positioning tolerances with respect to the busbar.

According to embodiments, the carrier can hold two magnetic detection elements. The carrier can have the shape of a cuboid. In the event that two magnetic detection elements are provided on the carrier, this is designed in such a way that one magnetic detection element is positioned above the upper side and one below the lower side of the busbar when the carrier reaches through the cutout in the busbar. In the event that only a single magnetic detection element is provided on the carrier, the magnetic detection element can be positioned above the upper side or below the lower side of the busbar when the carrier reaches through the cutout in the busbar.

According to embodiments, the carrier (board) can be C-shaped, so that the carrier grips around the busbar and thus positions the two magnetic detection elements accordingly above the upper side and below the lower side of the busbar. In the event that only a single magnetic detection element is provided on the carrier (C-shaped), the magnetic detection element can be positioned above the upper side or below lower side of the busbar if the carrier partially surrounds the busbar in the region of the cutout.

According to the embodiments of the carrier described here, it can be designed as a circuit board, which, in addition to the at least one magnetic detection element, also provides at least one electronic system for evaluating, filtering and/or amplifying the values detected by the at least one magnetic detection element.

The advantage of the design of the current sensor is that it has a low tolerance with respect to the position of the magnetic detection elements. If the magnetic detection elements are placed at Y=0, the influence of the positioning tolerances has the lowest effect there. However, if the magnetic detection elements are placed there, they have a low-pass behavior and the current sensor is more sensitive to low frequencies than to high ones. To compensate for this, an external high pass can be used, for example, which additionally attenuates the low frequencies.

According to embodiments, the magnetic detection element above the upper side of the busbar and the magnetic detection element below the lower side of the busbar can be electronically combined to form a magnetic detection element.

This has the advantage that external magnetic fields can be at least partially compensated for by the differential evaluation.

The carrier is positioned in the cutout along a Z coordinate direction, so that the carrier is oriented to be perpendicular to the busbar.

According to embodiments, the cutout in the region of the tapering is offset in the Y coordinate direction relative to an axis of symmetry of the busbar. As a result, the busbar has formed a first web with a first thickness and a second web with a second thickness in the region of the cutout, which differ in terms of thickness.

This configuration has the advantage that the frequency response is further smoothed and an operational amplifier can be saved. As a result, in this embodiment, the region with the lowest influence of mechanical tolerances shifts to y=2 mm. Due to the prevailing high-pass behavior there, the output signal does not need to be reduced for low frequencies. In other embodiments, the region with the least influence of mechanical tolerances can have a different value.

The at least one magnetic detection element arranged on the carrier can be assigned electronics for evaluating the measured values of the magnetic detection element. The electronics can, for example, include an additional filter circuit (snubber) with which the frequency response can then be further adjusted.

The current sensor according to the present disclosure can be used for the output busbars of the 3 motor phases of an electric motor. In this case, there are particularly strict requirements with regard to the accuracy of the current sensor, which are implemented by the design according to the present disclosure. Therefore, shielding or core material is omitted and a "coreless" current sensor is used. In contrast to current sensors with a core, this has no hysteresis around the zero point. Other advantages include lower weight and lower costs.

BRIEF DESCRIPTION OF THE DRAWINGS

The exemplary embodiments the present disclosure and the advantages thereof are explained in more detail below with reference to the accompanying figures. The proportions in the figures do not always correspond to the real proportions, since some shapes are simplified and other shapes are shown enlarged relative to other elements for better illustration. In the figures.

DETAILED DESCRIPTION

Identical reference symbols are used for elements of the present disclosure that are the same or have the same effect. Furthermore, for the sake of clarity, only those reference symbols that are necessary for the description of the respective figure are shown in the individual figures.

Figure 1:
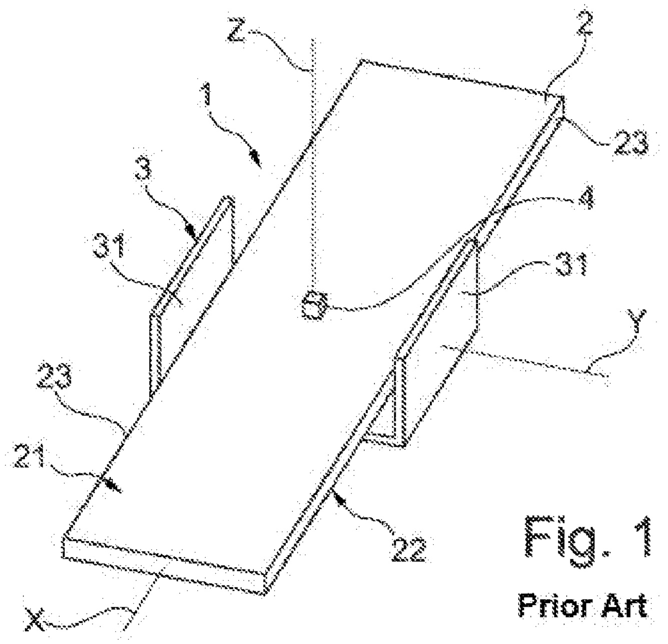
Fig. 1 Prior Art
FIG. 1 shows a perspective view of a current sensor according to the prior art.

FIG. 1 shows a perspective and schematic view of a current sensor 1 according to the prior art. In the embodiment shown here, a magnetic detection element 4 is arranged above an upper side 21 of a busbar 2 of the current sensor 1. A shielding 3 is an additional, flux-conducting material with which a magnetic field in the region of the magnetic detection element 4 of the current sensor 1 can be homogenized. In the embodiment shown here, the shielding 3 is U-shaped and arranged with respect to the busbar 2 in such a way that the shielding 3 is opposite a lower side 22 of the busbar 2 and one leg 31 of the shielding 3 is positioned to be opposite each lateral edge 23 of the busbar 2. An exact positioning of the magnetic detection element 4 with respect to the busbar 2 is therefore no longer critical.

Figure 2:
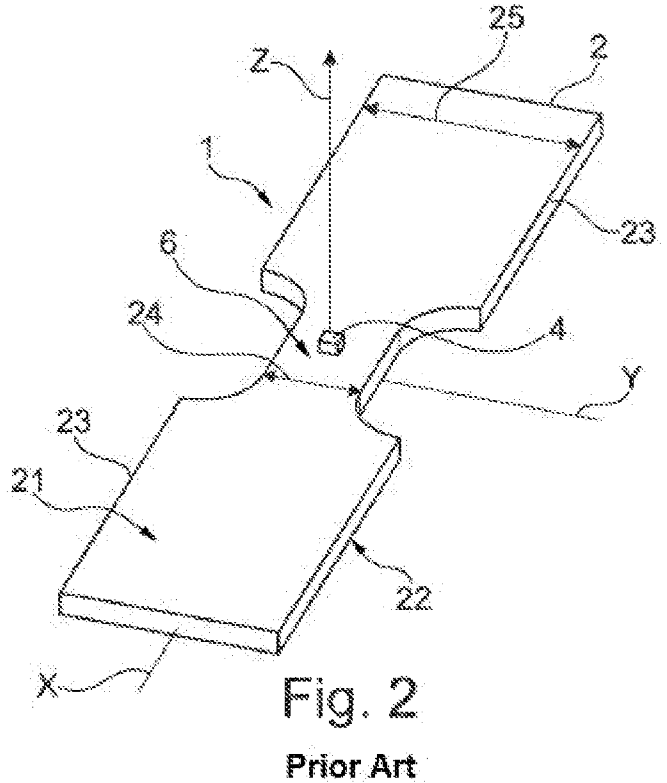
Fig. 2 Prior Art
FIG. 2 shows a perspective view of a further embodiment of the current sensor according to the prior art.

FIG. 2 shows a perspective view of a further embodiment of the current sensor 1 according to the prior art. The busbar 2 has a tapering 6 formed, on which the magnetic detection element 4 is positioned. At the tapering 6, a cross-section 24 of the busbar 2 is reduced compared to an original cross-section 25. By reducing the cross-section 24, on the one hand the signal level (flux density) increases, and on the other hand the dependence on the frequency is reduced. At the same time, however, the positioning of the magnetic detection element 4 becomes more critical.

Figure 3:
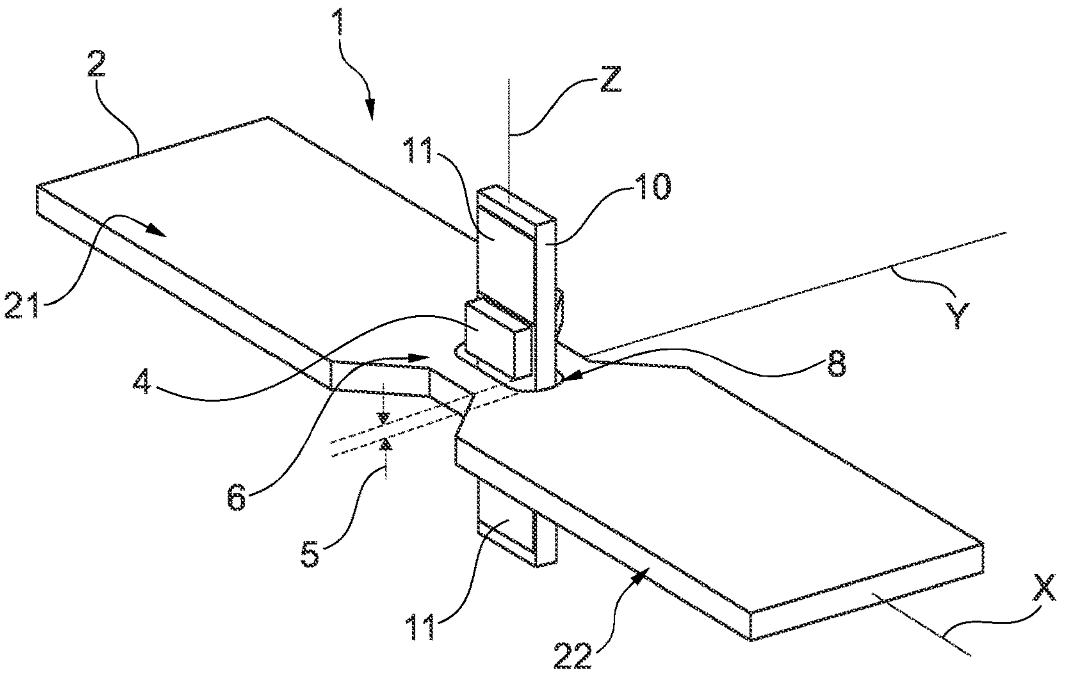
FIG. 3 shows a perspective view of a current sensor according to the present disclosure.

FIG. 3 shows a perspective view of a current sensor 1 according to the present disclosure. To further reduce the influence of the skin effect and at the same time maintain a homogeneous field centrally above or below the busbar 2, a cutout 8 (elongated hole) of the busbar 2 is introduced into the tapering 6 of the busbar 2. The cutout 8, which has the shape of an elongated slot (elongated hole), can be milled or punched. The cutout 8 is aligned to be lengthwise in the X coordinate direction X. The shape of the cutout 8 described here (elongated hole with rounded corners) and the shape of the tapering 6 should not be construed as a limitation of the present disclosure. As shown in FIG. 2, the tapering 6 can also be rounded or angular (see embodiment in FIG. 3). Alternatively, a rectangular cutout 8 and a rectangular notch as a tapering 6 would also be conceivable.

A carrier 10 is positioned in the cutout 8 along the Z coordinate direction Z in such a way that at least one magnetic detection element 4 held on the carrier 10 is positioned above the upper side 21 of the busbar 2, as shown in FIG. 3. A distance 5 between the magnetic detection element 4 and the upper side 21 of the busbar 2 can be adjusted by positioning the carrier 10 in the cutout 8. Although the positioning of the magnetic detection element 4 with respect to the upper side 21 of the busbar 2 is shown in FIG. 3, this should not be construed as a limitation of the present disclosure. According to the present disclosure, the magnetic detection element 4 can be positioned relative to the lower side 22 of the busbar 2 or relative to the upper side 21 of the busbar 2. Likewise, the magnetic detection element 4 can be positioned relative to the upper side 21 of the busbar 2 and the lower side 22 of the busbar 2. Consequently, the evaluation of the values detected by the magnetic detection element 4 does not take place within the cutout 8 but above and/or below the busbar 2, as is indicated in FIG. 3 by the magnetic detection element 4. Appropriate electronics 11 are provided on the carrier 10 for the evaluation. As shown here, the carrier 10 is aligned to be perpendicular to the busbar 2 when it is positioned in the cutout 8. The electronics 11 on the carrier 10 can be a filter circuit. On the other hand, a grounding surface can optionally be introduced on the carrier 10 to improve the electromagnetic compatibility (EMC). This can also be used to further compensate for the frequency response.

Figure 4:
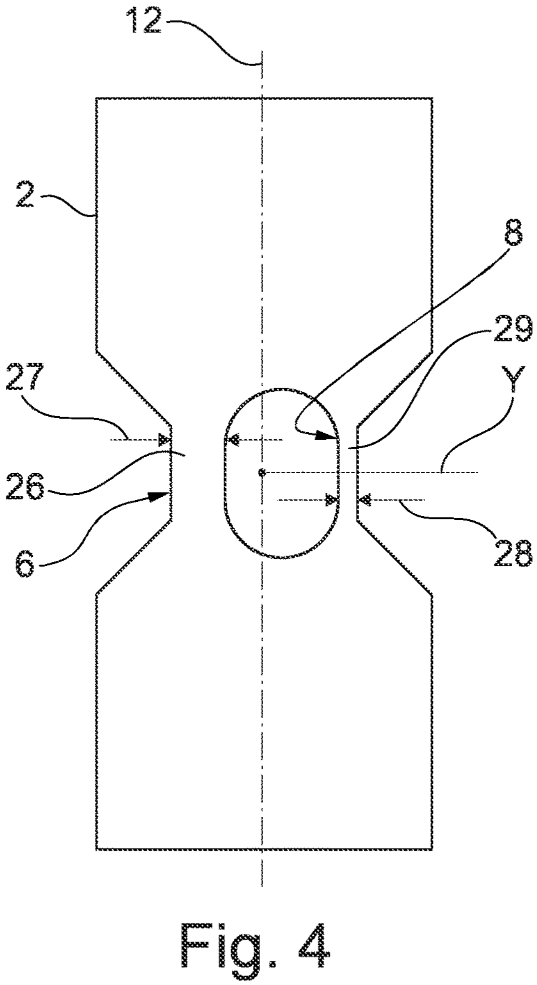
FIG. 4 shows an upper side view of an embodiment of the busbar according to the present disclosure.

FIG. 4 shows a plan view of an embodiment of the current sensor 2 according to the present disclosure. The cutout 8 is in the region of the tapering 6 offset in the Y coordinate direction Y relative to an axis of symmetry 12 of the busbar 2. The displacement of the cutout 8 results in a first web 26 with a first thickness 27 and a second web 28 with a second thickness 29 in the region of the cutout 8, which differ in terms of thickness. This asymmetrical structure of the busbar 2 has the advantage that the frequency response is further smoothed and an operational amplifier can be saved.

Figure 5:
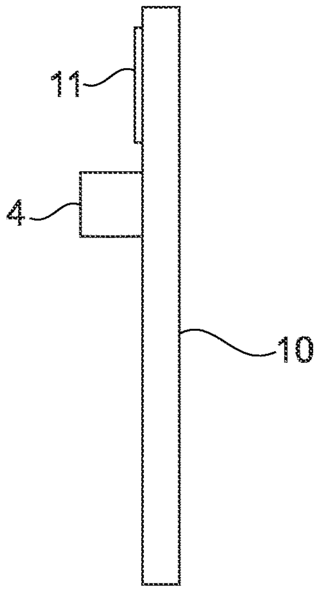
FIG. 5 shows a possible embodiment of the carrier for the magnetic detection element.
Figure 6:
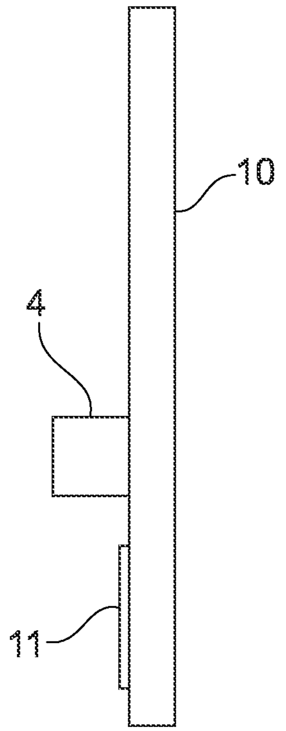
FIG. 6 shows a further possible embodiment of the carrier for the magnetic detection element.

FIG. 5 and FIG. 6 show possible embodiments of the carrier 10 for the magnetic detection element 4. In both figures, the magnetic detection element 4 is provided on one side of the carrier 10. Likewise, the magnetic detection element 4 is assigned electronics 11 for evaluating the measured values. The embodiment in FIG. 5 is used to position the magnetic detection element 4 relative to the upper side 21 of the busbar 2. The embodiment in FIG. 6 is used to position the magnetic detection element 4 relative to the lower side 22 of the busbar 2.

Figure 7:
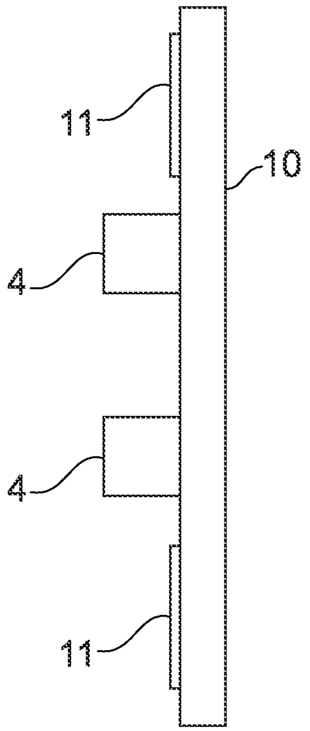
FIG. 7 shows an embodiment of the carrier for positioning two magnetic detection elements relative to the busbar.

FIG. 7 shows an additional embodiment of the carrier 10 for two magnetic detection elements 4. With this embodiment, measurements can be carried out using the magnetic detection elements 4 on the upper side 21 of the busbar 2 and on the lower side 22 of the busbar 2. Electronics 11 are each assigned to the magnetic detection elements 4.

Figure 8:
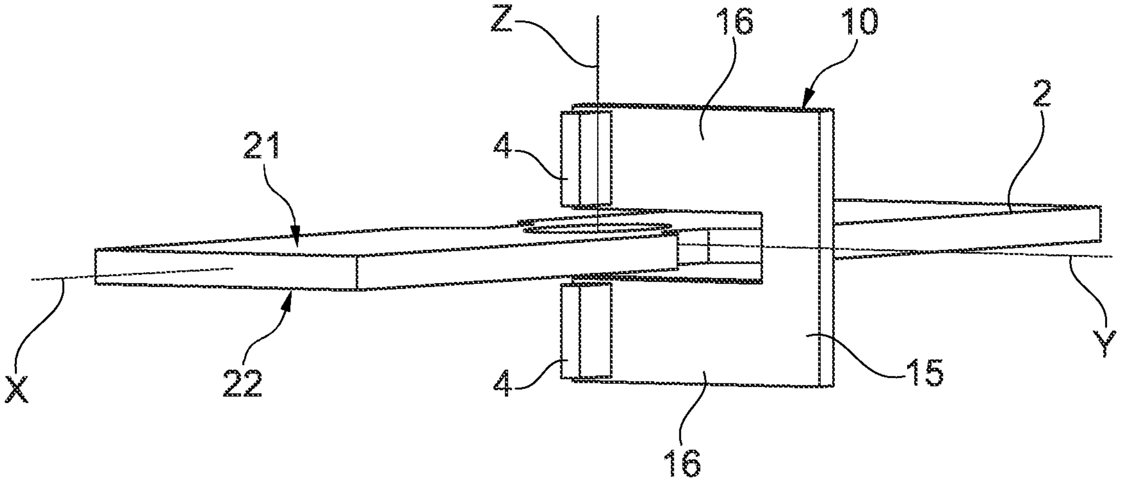
FIG. 8 shows a perspective view of a further embodiment of a current sensor, wherein the carrier partially surrounds the busbar for positioning two magnetic detection elements.
Figure 9:
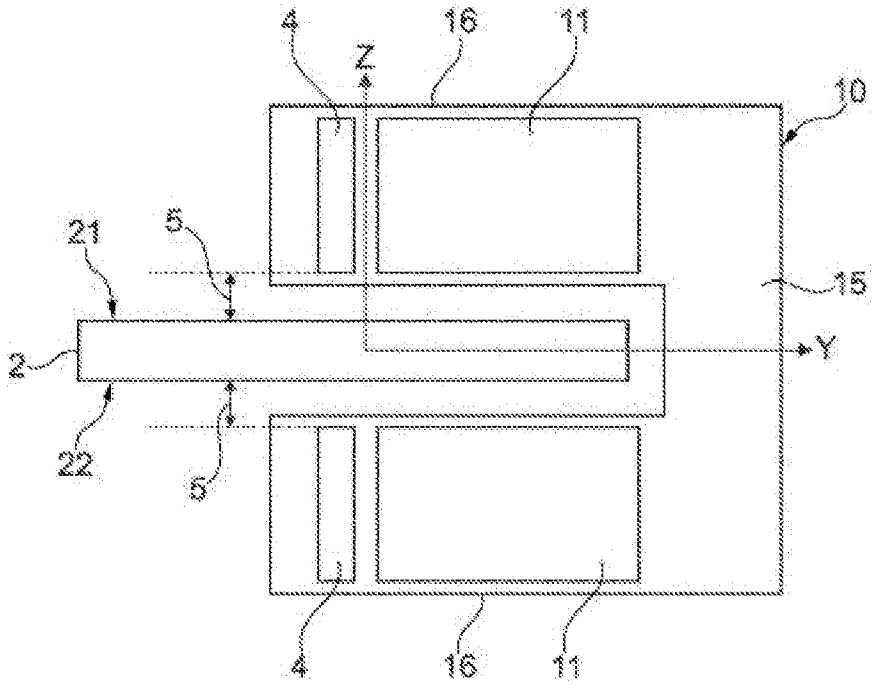
FIG. 9 shows a side view of the embodiment shown in FIG. 8.

FIG. 8 and FIG. 9 show a further embodiment of the carrier 10, which is C-shaped, for positioning two magnetic detection elements 4 relative to the busbar 2. Although with the embodiment described here two magnetic detection elements 4 are positioned with the carrier 10 with respect to the busbar 2, this should not be construed as a limitation. In the event that only one magnetic detection element 4 is attached to the C-shaped carrier 10, this can be positioned above the upper side 21 of the busbar 2 or below the lower side 22 of the busbar 2 at a predefined distance 5 in the Z coordinate direction Z.

The C-shaped carrier 10 has a base 15 and two legs 16. In the embodiment shown here, each leg 16 carries a magnetic detection element 4. The C-shaped carrier 10 is positioned relative to the busbar 2 in such a way that it partially surrounds the busbar 2. This means that the leg 16 is positioned above the upper side 21 of the busbar 2 and the other leg 16 is positioned below the lower side 22 of the busbar 2. The magnetic detection elements 4 held on the leg 16 are each positioned at a distance 5 in the Z coordinate direction Z from the upper side 21 or the lower side 22 of the busbar 2.

Figure 10:
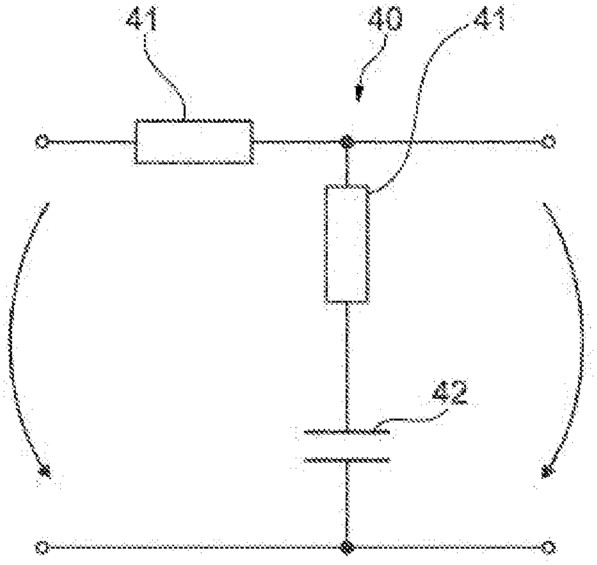
Fig. 10 Prior Art
FIG. 10 shows a possible embodiment of an additional filter circuit of the prior art with which the frequency response can be adjusted.

FIG. 10 shows a possible embodiment of an additional filter circuit 40 of the prior art, with which the frequency response can be adjusted. For example, the frequency response of the current sensor 1 can be straightened by the filter circuit 40, consisting of resistors 41 and a capacitor 42. It goes without saying for a person skilled in the art that inductors and active components, such as operational amplifiers, can also be used.

Figure 11:
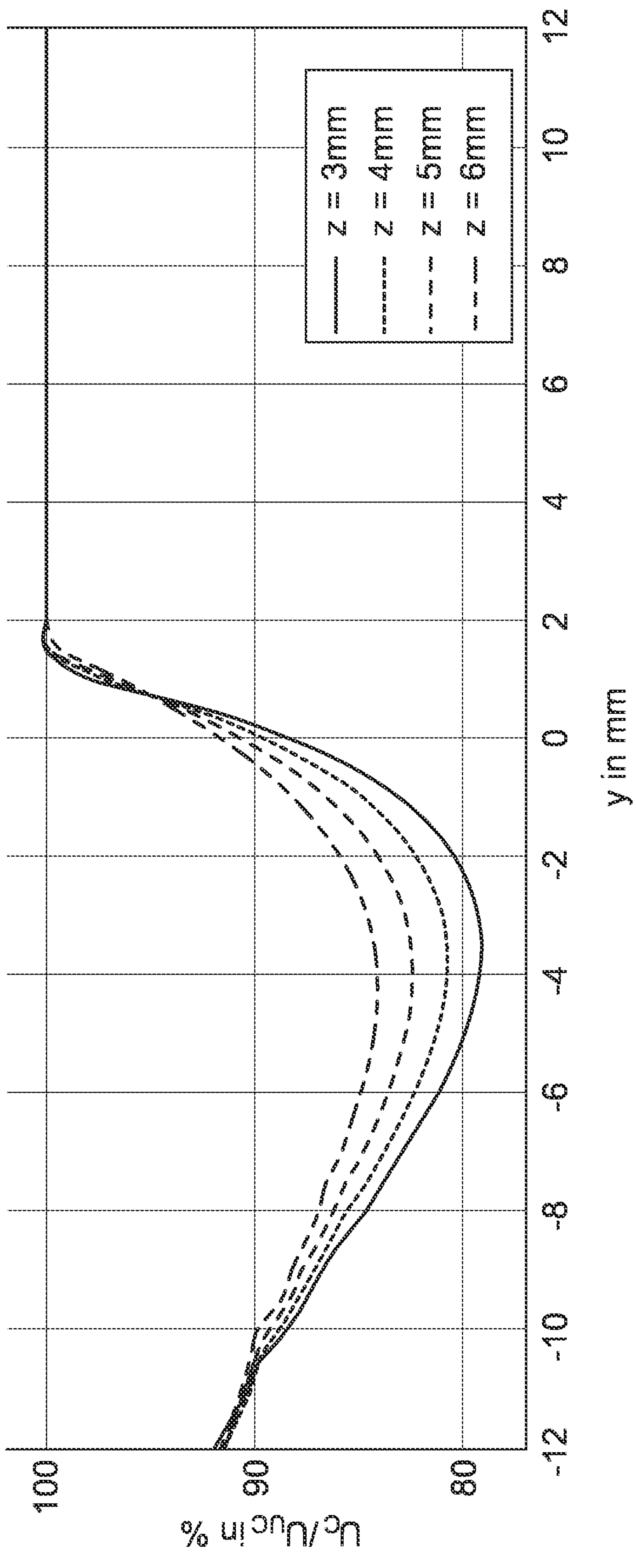
FIG. 11 shows the compensated voltage signal from a magnetic detection element in comparison to the uncompensated voltage signal.

FIG. 11 shows the compensated voltage signal from a magnetic detection element 4 in comparison to the uncompensated voltage signal. Here, the ratio of the compensated voltage signal to the uncompensated voltage signal is plotted in % as a function of the position of the magnetic detection element 4 in the Y coordinate direction Y. Four curves are plotted for different distances 5 (see FIG. 3) of the magnetic detection elements 4 in the Z coordinate direction Z from the busbar 2. The distance 5 of 3 mm is shown by the solid line. The distance 5 of 4 mm is shown by the dotted line. The distance 5 of 5 mm is shown by the dashed-dotted line. The distance 5 of 6 mm is shown by the dashed and double-dotted line.

Figure 12:
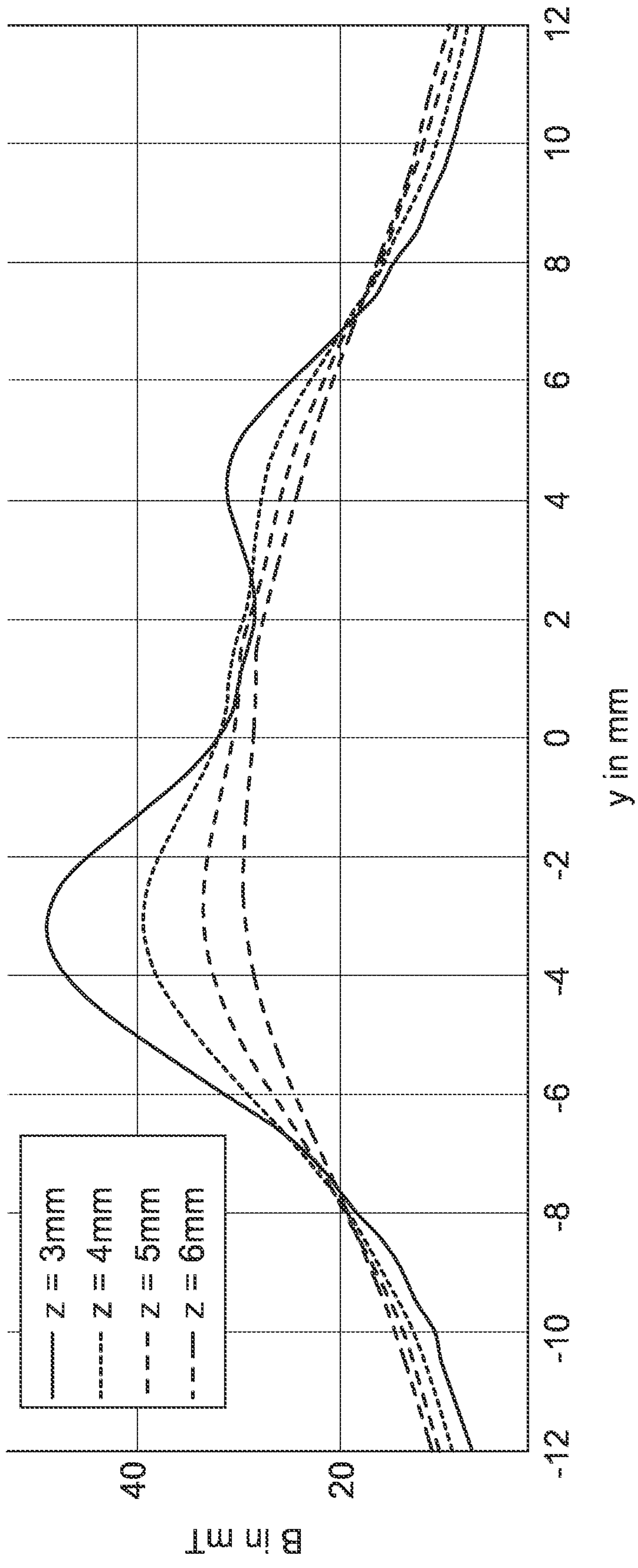
FIG. 12 shows a graphical representation of the tolerance of the present disclosure to the position of a magnetic sensing element.

FIG. 12 shows a graphical representation of the tolerance of the present disclosure to the position of a magnetic sensing element 4. With the present geometry, the magnetic detection elements 4 already have a small tolerance with respect to the position with respect to the busbar 2. In FIG. 10, the magnetic field strength in mT is plotted as a function of the position of the magnetic detection element 4 in the Y coordinate direction Y. Four curves are plotted for different distances 5 (see FIG. 3) of the magnetic detection element 4 in the Z coordinate direction Z from the busbar 2. The distance 5 of 3 mm is shown by the solid line. The distance 5 of 4 mm is shown by the dotted line. The distance 5 of 5 mm is shown by the dashed-dotted line. The distance 5 of 6 mm is shown by the dashed and double-dotted line. At y=0, all curves have a slight slope other than zero. In addition, the curves there are very close to each other. Therefore, the influence of the positioning tolerances has the lowest impact there. However, if the magnetic detection element 4 is placed in the range from y=0 to approximately y=2 mm, it has a low-pass behavior (the magnetic detection elements 4 are more sensitive to low frequencies than to high ones). To compensate for this, for example, an external high pass can be used, which additionally attenuates the low frequencies. For the present case this is necessary in the range y<2 mm.

The conditions described in FIGS. 11 and 12 arise for webs (see FIG. 4) with different thicknesses. As can be seen from FIG. 12, a range of 0<y<approx. 2 mm is relatively tolerant of positioning errors. From y>approx. 2 mm, the signal no longer needs to be increased (see FIG. 11), so that the optimal position of the magnetic detection element 4 is given for y=2 mm.

Figure 13:
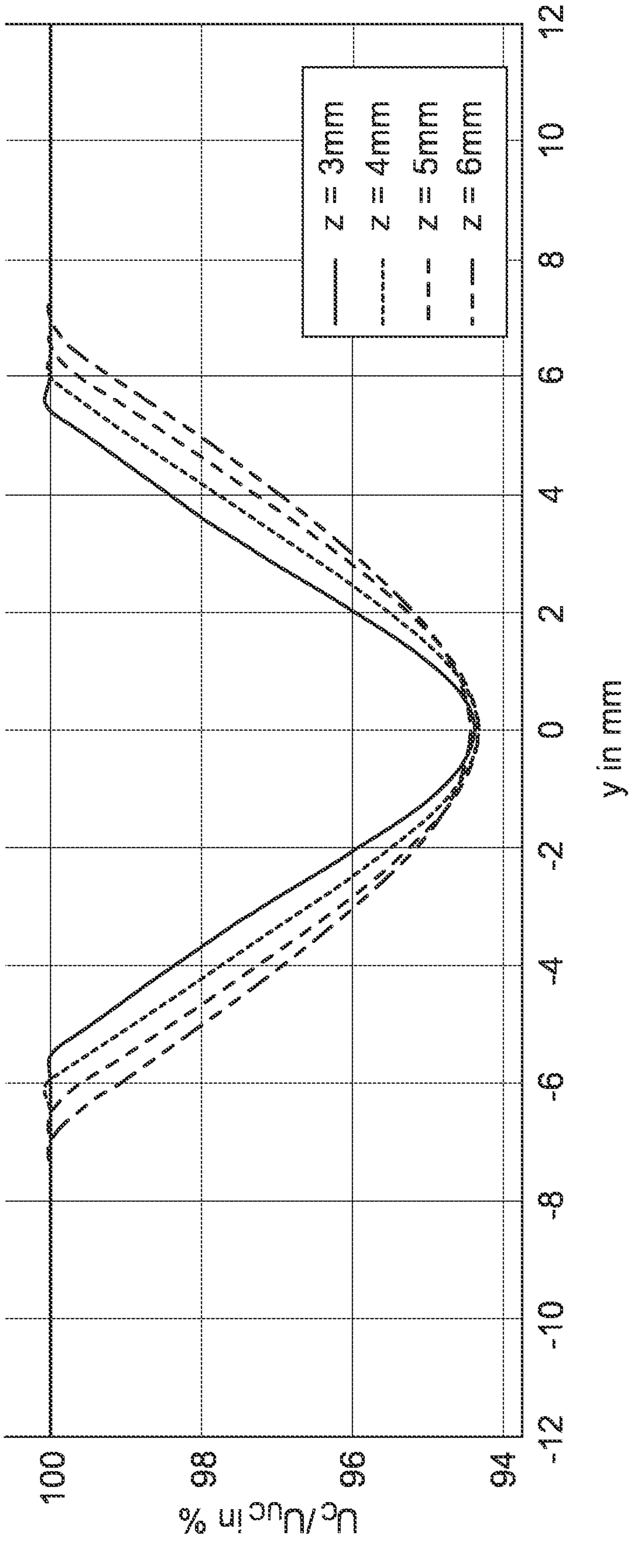
FIG. 13 shows the compensated voltage signal from two magnetic detection elements compared to the uncompensated voltage signal.

FIG. 13 shows the compensated voltage signal from two magnetic detection elements 4 in comparison to the uncompensated voltage signal. Here, the ratio of the compensated voltage signal to the uncompensated voltage signal is plotted in % as a function of the position of the magnetic detection elements 4 in the Y coordinate direction Y. Four curves are plotted for different distances 5 (see FIG. 3) of the magnetic detection elements 4 in the Z coordinate direction Z from the busbar 2. The distance 5 of 3 mm is shown by the solid line. The distance 5 of 4 mm is shown by the dotted line. The distance 5 of 5 mm is shown by the dashed-dotted line. The distance 5 of 6 mm is shown by the dashed and double-dotted line. After the filter, the signal must be increased to 100% again using an operational amplifier.

Figure 14:
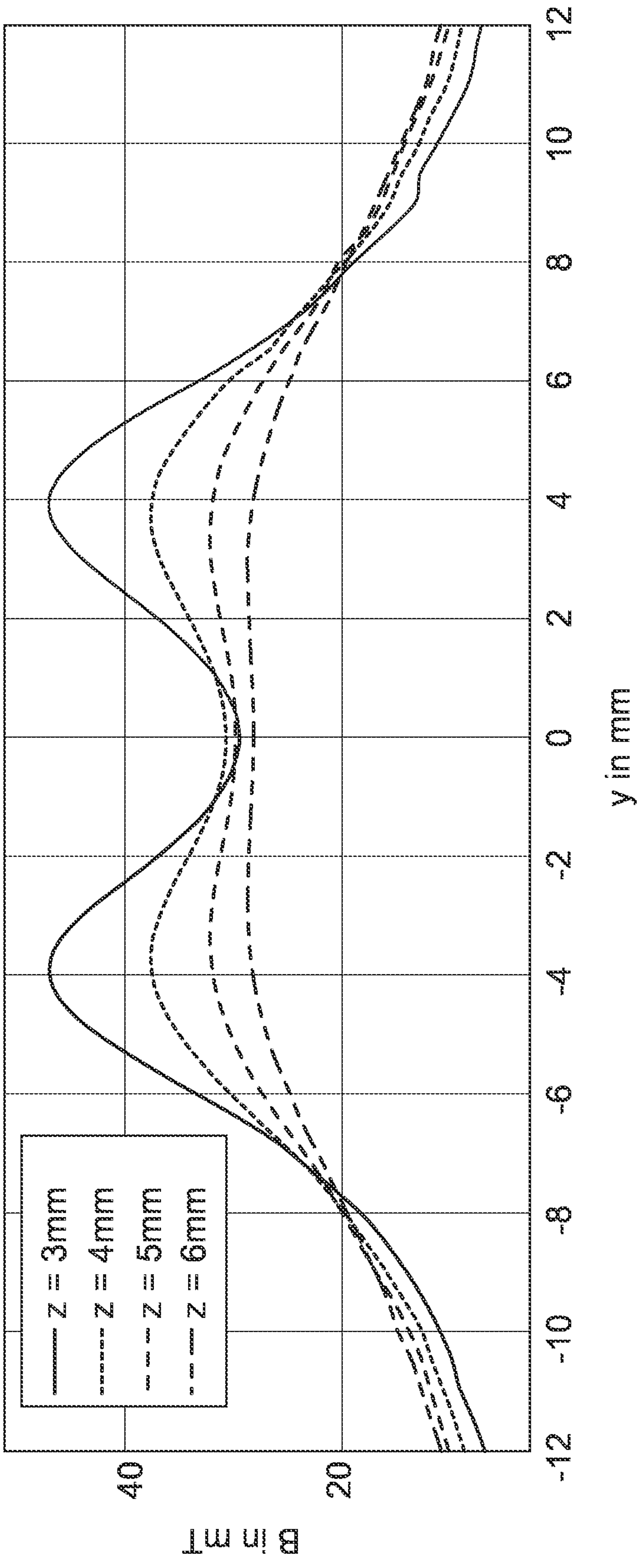
FIG. 14 shows a graphical representation of the present disclosure's tolerance to the position of the two magnetic sensing elements.

FIG. 14 shows a graphical representation of the tolerance of the present disclosure to the position of the two magnetic sensing elements 4. With the present geometry, the magnetic detection elements 4 already have a small tolerance with respect to the position with respect to the busbar 2. In FIG. 14, the magnetic field strength in mT is plotted as a function of the position of the magnetic detection elements 4 in the Y coordinate direction Y. Four curves are plotted for different distances 5 (see FIG. 3) of the magnetic detection elements 4 in the Z coordinate direction Z from the busbar 2. The distance 5 of 3 mm is shown by the solid line. The distance 5 of 4 mm is shown by the dotted line. The distance 5 of 5 mm is shown by the dashed-dotted line. The distance 5 of 6 mm is shown by the dashed and double-dotted line. All curves have a slope of zero at y=0. In addition, the curves there are very close to each other. Therefore, the influence of the positioning tolerances has the lowest impact there. However, if the two magnetic detection elements 4 are placed there, they have a low-pass behavior (the magnetic detection elements 4 are more sensitive to low frequencies than to high ones). To compensate for this, an external high pass can be used, for example, which additionally attenuates the low frequencies. For this case this is necessary in the range −7 mm<y<+7 mm.

LIST OF REFERENCE SYMBOLS

1 Current sensor
2 Conductor rail
3 Shielding
4 Magnetic detection element
5 Distance
6 Tapering
8 Cutout
10 Carrier
11 Electronics
12 Axis of symmetry
15 Base
16 Leg
21 Upper side
22 Lower side
23 Lateral edge
24 Reduced cross-section
25 Original cross-section
26 First web
27 First thickness
28 Second web
29 Second thickness
31 Leg
40 Filter circuit
41 Resistor
42 Capacitor
X X-coordinate direction Y Y-coordinate direction
Z Z-coordinate direction

The invention claimed is:

1. A current sensor comprising: an electrically conductive busbar having an upper side and a lower side, wherein a tapering is formed in the busbar and a cutout is formed in the busbar adjacent to the tapering; and a magnetic detection element is assigned to the busbar adjacent to the tapering; and a carrier supporting the magnetic detection element is positioned relative to the cutout in such a way that the magnetic detection element is positioned relative to the busbar one of above the upper side or below the lower side of the busbar;
  - wherein the carrier is positioned along a Z coordinate direction in the cutout and is oriented perpendicular to the busbar; and
  - wherein the magnetic detection element is aligned with at least a portion of the cutout in a Z coordinate direction;
  - wherein the busbar is planar in a region of the cutout extending across the busbar at the tapering and including the cutout, and the magnetic detection element is spaced from the cutout in the busbar; and
  - wherein, at the tapering, a cross-section of the busbar is reduced compared to an original cross-section.

2. The current sensor according to claim 1, wherein the carrier has a shape of a rectangular cuboid.

3. The current sensor according to claim 2, wherein the current sensor includes a further magnetic detection element supported on the carrier, the magnetic detection element being positioned above the upper side of the busbar and the further magnetic detection element being positioned below the lower side of the busbar.

4. The current sensor according to claim 1, wherein the magnetic detection element and a further magnetic detection element are electronically combined.

5. The current sensor according to claim 1, wherein the cutout is offset in a Y coordinate direction relative to an axis of symmetry of the busbar such that the busbar, adjacent to the cutout, has a first web with a first thickness and a second web with a second thickness that differs from the first thickness.

6. The current sensor according to claim 1, wherein the cutout is an elongated hole aligned in a X coordinate direction adjacent to the tapering of the busbar.

7. The current sensor according to claim 1, wherein the magnetic detection element is assigned electronics for evaluating measured values of the magnetic detection element.

8. The current sensor according to claim 1, wherein the magnetic detection element is assigned to an output-side busbar of a three-phase motor.

9. The current sensor according to claim 1, wherein the current sensor includes a further magnetic detection element supported on the carrier, the magnetic detection element being positioned above the upper side of the busbar and the further magnetic detection element being positioned below the lower side of the busbar.

10. The current sensor according to claim 9, wherein the magnetic detection element and the further magnetic detection element are electronically combined.

11. A current sensor comprising:
  - an electrically conductive busbar including:
  - a first lateral edge and a second lateral edge spaced from each other, the first lateral edge including a first tapering extending towards the second lateral edge, and the second lateral edge including a second tapering extending towards the first lateral edge;
  - an upper side and a lower side spaced from each other, the upper side and the lower side each extending from the first lateral edge to the second lateral edge; and a cutout extending through the upper side and the lower side, the cutout disposed between the first and second taperings, and the busbar being planar in a region of the cutout;
  - a carrier; and
  - a magnetic detection element supported by the carrier, wherein the carrier is positioned relative to the cutout such that the magnetic detection element is spaced from the upper side and the lower side of the busbar;
  - wherein the carrier is positioned along a Z coordinate direction in the cutout and is oriented perpendicular to the busbar;
  - wherein the magnetic detection element is aligned with at least a portion of the cutout in a Z coordinate direction; and
  - wherein, between the first tapering and the second tapering, a cross-section of the busbar is reduced compared to an original cross-section.

12. The current sensor according to claim 11, wherein the magnetic detection element is arranged one of above the upper side of the busbar or below the lower side of the busbar.

13. The current sensor according to claim 11, further comprising a further magnetic detection element supported by the carrier, wherein the magnetic detection element is arranged above the upper side of the busbar and the further magnetic detection element is arranged below the lower side of the busbar.

14. The current sensor according to claim 11, wherein carrier has a rectangular cuboid shape and extends through the cutout.

15. The current sensor according to claim 11, wherein the cutout is offset relative to the first and second lateral edges such that the busbar includes: a first web arranged between the cutout and the first lateral edge; and a second web arranged between the cutout and the second lateral edge, wherein a thickness of the first web differs from a thickness of the second web.

16. The current sensor according to claim 11, wherein the magnetic detection element is assigned electronics for evaluating measured values of the magnetic detection element.

17. The current sensor according to claim 11, wherein the magnetic detection element is assigned to an output-side busbar of a three-phase motor.

* * * * *